United States Patent [19]

Ma

[11] Patent Number: 4,619,000
[45] Date of Patent: Oct. 21, 1986

[54] CATV CONVERTER HAVING IMPROVED TUNING CIRCUITS

[76] Inventor: John Ma, 499 Dundee Ave., Milpitas, Calif. 90535

[21] Appl. No.: 654,201

[22] Filed: Sep. 24, 1984

[51] Int. Cl.<sup>4</sup> .......................... H04B 1/18; H03J 1/26; H03J 1/16
[52] U.S. Cl. .................................. 455/131; 455/191; 455/301; 455/315; 455/340
[58] Field of Search ............. 455/339, 340, 197, 300, 455/301, 131, 191, 314, 315; 333/175; 334/71, 85

[56] References Cited

U.S. PATENT DOCUMENTS

| | | |
|---|---|---|
| 3,226,645 | 12/1965 | Harwood et al. . |
| 3,309,613 | 3/1967 | Bell . |
| 3,333,198 | 7/1967 | Mandell et al. . |
| 3,624,515 | 11/1971 | Rezek ................................. 455/340 |
| 3,643,168 | 2/1972 | Manicki ............................. 455/300 |
| 3,742,131 | 6/1973 | Rogeness . |
| 4,204,166 | 5/1980 | Araki ................................. 455/340 |
| 4,214,212 | 7/1980 | Dipietromaria . |
| 4,352,209 | 9/1982 | Ma . |
| 4,490,699 | 12/1984 | Yanagida ............................ 455/315 |
| 4,520,507 | 5/1985 | Moon ................................. 455/315 |

Primary Examiner—Jin F. Ng
Assistant Examiner—Curtis Kuntz
Attorney, Agent, or Firm—Leydig, Voit & Mayer, Ltd.

[57] ABSTRACT

The disclosure describes an improved CATV converter that incorporates an intermediate frequency filter and amplifier unit that includes first and second tunable circuits. Each tunable circuit has a fixed capactive element and a variable inductance means for tuning the tunable circuit. The first and second tuned circuit are transmissively coupled to one another through a slit in a shield which otherwise shields one tunable circuit from another. The intermediate frequency filter and amplifier unit also includes an FET for amplifying a narrow band intermediate frequency signal and a third tunable circuit comprising the output capacitance of the FET and a variable inductance means for tuning the third tunable circuit.

7 Claims, 2 Drawing Figures

CATV CONVERTER HAVING IMPROVED TUNING CIRCUITS

FIELD OF THE INVENTION

The present invention relates to community antenna television (CATV) systems. In particular, it relates to CATV converters.

BACKGROUND OF THE INVENTION

In a CATV system, a head end subsystem, which typically includes a remote community antenna, gathers video signals from a variety of sources (e.g., satellite broadcasts, local and distant VHF and UHF stations, and the like) and combines these signals to form a composite CATV signal. The composite CATV signal comprises a wide band of frequencies, ranging from approximately 50 to 450 MHz, and is divided into over 30 6-MHz-wide narrow bands of frequencies, called channels, including channels 2–13 familiar to non-pay television viewers. The composite CATV signal is supplied from the head end subsystem to local subscribers, principally homeowners, who receive the signal via a coaxial cable. Once received, the desired channel must be separated from the composite CATV signal and then supplied to the subscriber's television.

A device for selecting one channel from the composite CATV signal is known in the art as a CATV converter and has been described, for example, in Ma U.S. Pat. No. 4,352,209. To minimize interference between channels, an ideal CATV converter must pass intact all components of the CATV signal within the narrow band of frequencies corresponding to the selected channel and totally reject all other components. Real CATV converters approximate this ideal behavior by stringing together electrical filters, called tunable resonant circuits. Each tunable resonant circuit is tuned to a particular frequency, called its resonant frequency, where the components at the resonant frequency, or within a narrow band of frequencies clustered about the resonant frequency, are passed and all other components are attenuated. The more tunable resonant circuits that are utilized, the more effectively out-of-band components are rejected. However, the number of tunable resonant circuits has an upper limit where, for example, the cost of adding one more tunable resonant circuit outweighs the benefit derived.

In accordance with this economic upper limit, the CATV converter described in the Ma '209 patent utilized four tunable resonant circuits for channel selection. Each tunable resonant circuit included a fixed inductive element and a variable capacitive element for tuning the circuit. However, variable capacitors respond erratically as their temperature varies, as they age, or as they undergo mechanical shock, such as by dropping. Consequently, the performance of the CATV converter might vary with temperature, time or the amount of handling it undergoes.

SUMMARY OF THE INVENTION

A primary object of the present invention is to provide an improved CATV converter that has an enhanced channel selection capability and yet is extremely economical to manufacture. A related object of this invention is to provide an improved CATV converter that sharply rejects components of the CATV signal not within the narrow band of frequencies corresponding to the selected channel.

Another important object of this invention is to provide an improved CATV converter that is highly durable and reliable. A related object of this invention is to provide an improved CATV converter that performs very consistently despite variations in temperature, that is highly insensitive to mechanical shock, and that holds up well with aging.

Another important object of this invention is to provide an improved CATV converter that effectively isolates the various manifestations of the CATV signal from one another.

Other objects and advantages of this invention will become apparent from the following detailed description and the accompanying drawings.

In accordance with one aspect of the present invention, the foregoing objects are realized by a CATV converter having a filter that has at least two tunable resonant circuits, wherein each circuit includes a fixed capacitive element coupled to a variable inductance means for tuning the circuit. The two tunable resonant circuits are transmissively coupled to each other through an aperture in a shield which otherwise shields one tunable resonant circuit from another.

In accordance with a second aspect of the present invention, the foregoing objects are realized by a CATV converter having a device which comprises a means for amplifying certain frequency components derived from the CATV signal and a tunable resonant circuit including an inductive element directly coupled to the output capacitance of the amplifying means.

DESCRIPTION OF A PREFERRED EMBODIMENT OF THE INVENTION

Figure 1:
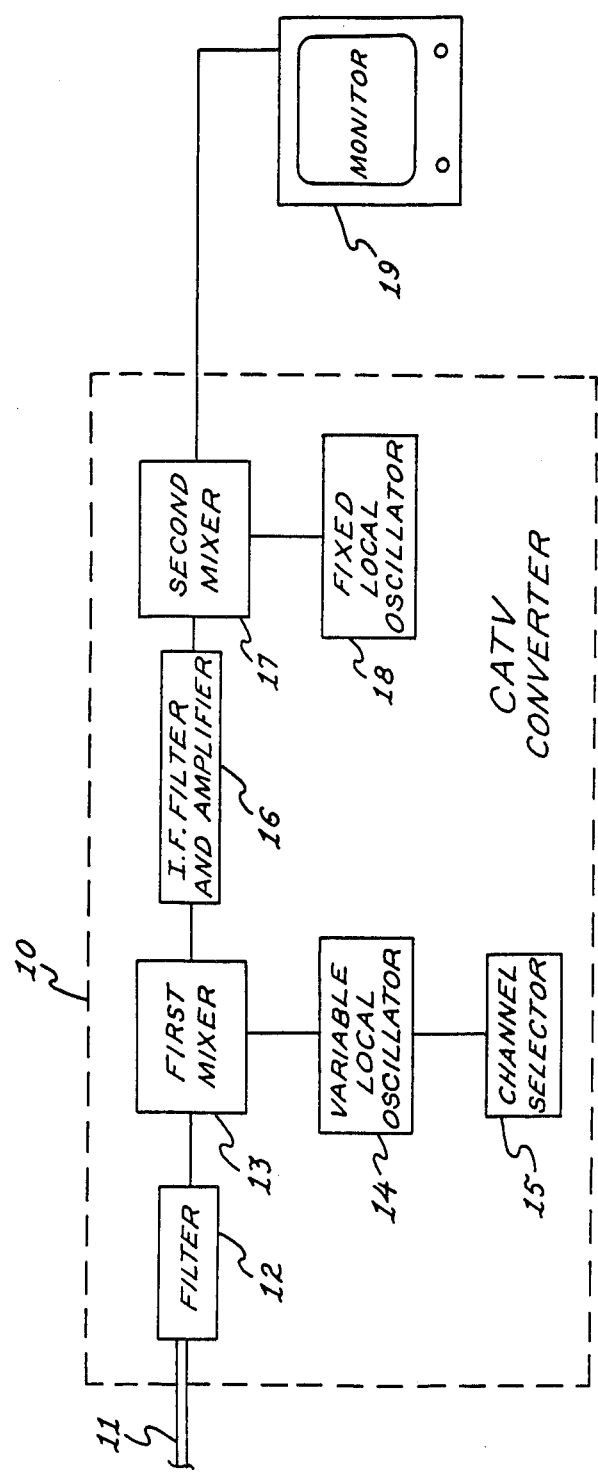
FIG. 1 is a block diagram of a CATV converter of the present invention.

As shown in FIG. 1, a CATV converter 10 of the present invention comprises several components. The converter 10 receives a CATV signal from a remote antenna (not shown) via a coaxial cable 11. The received signal is initially supplied to a filter circuit 12, which may comprise any of several standard bandpass filter designs. The filter circuit 12 attenuates the superfluous frequency components of the received signal and supplies a filtered signal composed of a wide band of frequencies to a first mixer 13. This wide band of frequencies typically ranges from approximately 50 to 450 MHz and includes a 6 MHz frequency band for each of over 30 designated CATV channels.

The first mixer 13 also receives a single-frequency signal from a variable local oscillator 14, where the single frequency of this signal is determined according to a channel selector 15. (The first mixer 13, the variable local oscillator 14, and the channel selector 15 each may also comprise any of several standard designs.) In response to this single-frequency signal, the first mixer 13 "up converts" the frequency of each frequency component of the filtered CATV signal by an amount depending on the frequency of the single-frequency signal from the variable local oscillator 14. Typically, the entire band of frequencies composing the filtered CATV signal is up-converted to an intermediate band of frequencies above 450 MHz.

The first mixer 13 supplies the up-converted intermediate frequency (I.F.) signal to an I.F. filter and amplifier unit 16 which attenuates all of the frequency components of the up-converted I.F. signal except a narrow band of frequencies clustered about a center frequency defined by the filter portion of the I.F. filter and amplifier unit 16. The width of this narrow band of frequencies corresponds to the bandwidth for a single CATV channel, i.e., approximately 6 MHz. The I.F. filter and amplifier unit 16 also amplifies the narrowband I.F. signal and then supplies the signal to a second mixer 17.

The second mixer 17 also receives a single-frequency signal from a fixed local oscillator 18. (The second mixer 17 and the fixed local oscillator 18 each may also comprise any of several standard designs.) In response to this single-frequency signal, the second mixer 17 "down-converts" the 6 MHz wide narrowband I.F. signal to a 6 MHz wide narrowband signal having a center frequency equal to the center frequency of a locally unused VHF channel, e.g., channel 2, 3 or 4 (i.e., 57, 63 or 69 MHz). This down-converted signal is then supplied to a TV monitor 19 where the CATV channel is viewed on the locally unused VHF channel.

The I.F. filter and amplifer unit 16 in conjunction with the channel selector 15 determine which of the many CATV channels supplied by the coaxial cable 11 is received by the TV monitor 19. For example, if the center frequency defined by the filter in the I.F. filter and amplifier unit 16 is 611 MHz, and if it is desired to view CATV channel 7 (i.e., a 6 MHz band of frequencies centered about 177 MHz), then the channel selector 15 is adjusted to produce a single-frequency signal output from the variable local oscillator 14 in response to which the first mixer 13 up-converts the frequency components of the filtered signal by 434 MHz. Since the center frequency of channel 7 is the only frequency up-converted to 611 MHz, it is the only channel passed by the I.F. filter and amplifier unit 16 and, thus, is the only channel received by the TV monitor 19.

Figure 2:
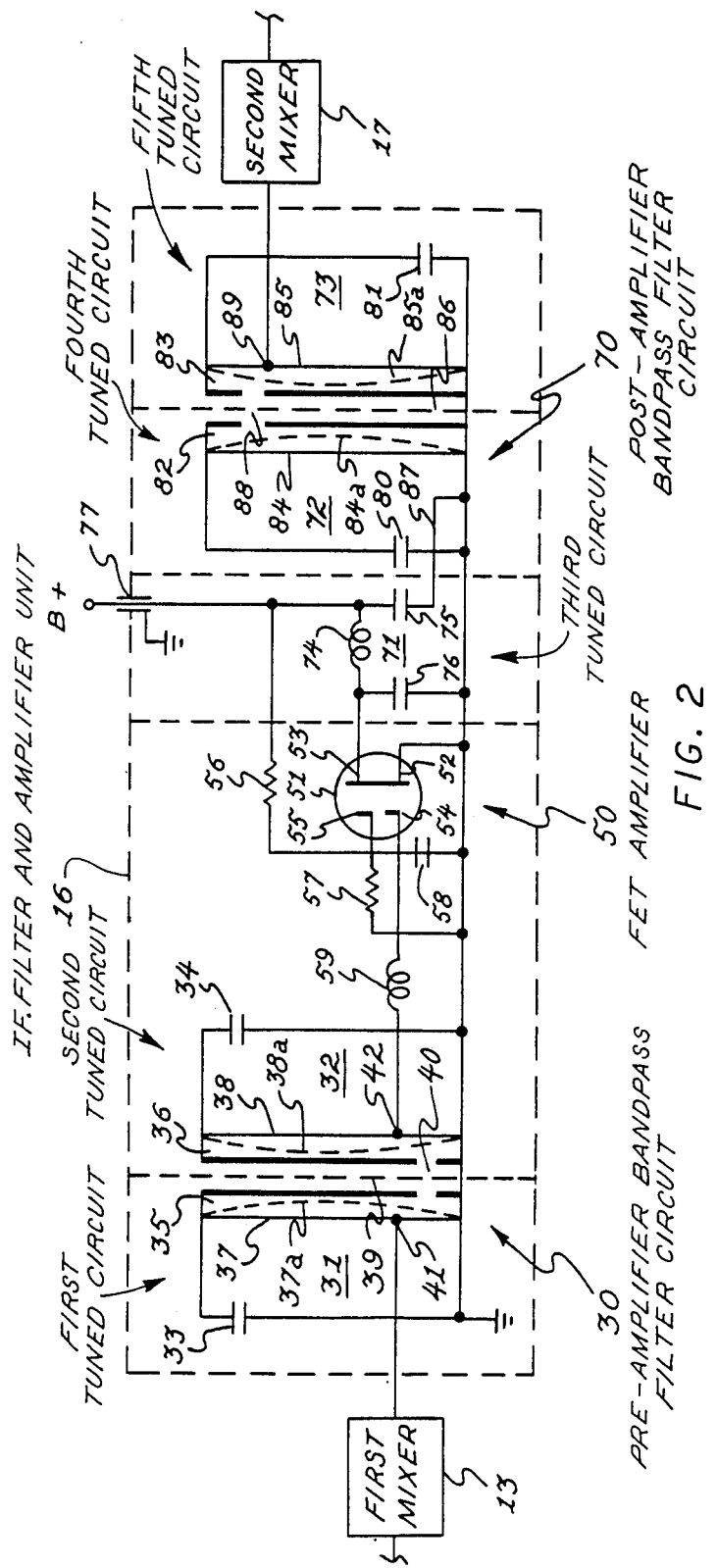
FIG. 2 is a circuit diagram of the I.F. filter and amplifier unit of the CATV converter of FIG. 1.

Since the I.F. filter and amplifier unit 16 plays such an integral role in determining the signal received by the TV monitor 19, the ability of the I.F. filter and amplifier unit 16 to reject frequency components that are not within the 6 MHz channel bandwidth is critical. In accordance with a central aspect of the invention, an improved I.F. filter and amplifier unit 16 is provided having a markedly superior out-of-band rejection capability, while costing significantly less, than previous I.F. filter and amplifier units. As shown in FIG. 2, an I.F. filter and amplifier unit 16 of the present invention includes a pre-amplifier bandpass filter circuit 30, a dual gate FET amplifier circuit 50, and a post-amplifier bandpass filter circuit 70. Generally, the pre-amplifier bandpass filter circuit 30 receives the up-converted wideband I.F. signal from the first mixer 13 and attenuates the frequency components of the wideband signal that are outside of a certain narrow band of frequencies clustered about a center frequency defined by the resonant frequency of the pre-amplifier bandpass filter circuit 30; the dual gate FET amplifier circuit 50 amplifies the narrowband I.F. signal passed by the pre-amplifier bandpass filter circuit 30; and the post-amplifier bandpass filter circuit 70, which is designed to pass the same narrow band of frequency components as the pre-amplifier bandpass filter circuit 30, further attenuates the out-of-band frequency components of the amplified signal. The amplified narrowband I.F. signal is then supplied to the second mixer 17 where it is down-converted.

The pre-amplifier bandpass filter circuit 30 comprises first and second tunable circuits 31, 32. Each tunable circuit 31, 32 includes a fixed capacitor 33, 34 and a resonant element 35, 36 having an inductive wire 37, 38 disposed in proximity to a shield 39 which separates the two tunable circuits 31, 32. One end of each resonant element 35, 36 is grounded directly while the other end is connected to ground through the fixed capacitor 33, 34. The first tunable circuit 31, which resonates at a frequency principally defined by the inductance of the wire 37 and the capacitance of the fixed capacitor 33 of that circuit 31, and the second tunable circuit 32, which resonates at a frequency principally defined by the inductance of the wire 38 and the capacitance of the fixed capacitor 34 of that circuit 32, are tuned to the same resonant frequency and are transmissively coupled to one another through a slit 40 in the shield 39.

The wideband I.F. signal is received from the first mixer 13 by the first tunable circuit 31 at a certain point 41 along the inductive wire 37. (The location of this point 41 may be determined according to standard impedance matching techniques where the output impedance of the first mixer 13 is matched to the input impedance of the FET amplifier circuit 50 while the noise mismatch is optimized.) The signal is then filtered by the first tunable circuit 31, transmitted to the second tunable circuit 32 via the slit 40, and filtered by the second tunable circuit 32. Since the first and second tunable circuits 31, 32 are tuned to the same resonant frequency, the pre-amplifier bandpass filter circuit 30 passes only a narrow band of frequency components of the wideband I.F. signal clustered about the resonant frequency and attenuates all other frequency components. In one embodiment of the invention, the first and second tunable circuits 31, 32 are tuned to a resonant frequency of 611 MHz and are designed to pass a 6 MHz band of frequency components i.e., one channel bandwidth.

In the pre-amplifier bandpass filter circuit 30 of the present invention, the capacitors 33, 34 in the slit-coupled tunable circuits 31, 32 are fixed, and the circuits 31, 32 are tuned by adjusting the inductance of the inductive wires 37, 38. The inductance in each tunable circuit 31, 32 is adjusted by changing the position of the wire 37, 38 in relation to the shield 39, as, for example, by bending the wire 37a, 38a. This represents a significant advance over prior CATV converters, which utilized tunable circuits having loop elements for coupling the circuits and variable capacitors for tuning the circuits. Since the coupling between these tunable circuits was so strongly dependent on the position of the inductive wires and the loop element in relation to one another, once a desired coefficient of coupling was attained the position of the inductive wires could not be changed without drastically altering the coupling between the circuits. Consequently, variable capacitors were used to tune these circuits. However, the slit-coupling between the tunable circuits 31, 32 of the present invention is much less dependent on the position of the inductive wires 37, 38. Consequently, these circuits 31, 32 may be tuned by adjusting the position of the inductive wires 37, 38 in relation to the shield 39, and fixed capacitors 33, 34 may be used instead of the far more expensive variable capacitors. Even more importantly, the use of fixed capacitors 33, 34 results in a more durable and reliable CATV converter because fixed capacitors are far less susceptible to mechanical shock, develop fewer defects as they age, and have temperature coefficients which fall within narrower tolerances than variable capacitors.

From the pre-amplifier band pass filter circuit 30, the narrowband I.F. signal is supplied to the dual gate FET amplifier circuit 50, which principally comprises a field effect transistor (FET) 51 having a source 52, a drain 53, and first and second gates 54, 55. The source 52 is connected directly to ground, and the second gate 55 is connected to a biasing network comprised of two bias resistors 56, 57 and a shunt capacitor 58. From a certain point 42 (also determined in accordance with standard impedance matching techniques) on the inductive wire 38 of the second tunable circuit 32, the narrowband I.F. signal is fed through an inductor 59 to the first gate 54 of the FET 51. The inductor 59 comprises a loosely coiled length of wire that primarily serves to provide a flexible lead from the bendable inductive wire 36 of the second tunable circuit 32 to the first gate 54 of the FET 51. The FET 51 then amplifies the narrowband I.F. signal and supplies the amplified signal from the drain 53.

From the dual gate FET amplifier circuit 50, the amplified narrowband I.F. signal is supplied to the post-amplifier bandpass filter circuit 70, which comprises third, fourth, and fifth tunable circuits 71, 72, 73. The third tunable circuit 71 includes an inductor 74, a blocking capacitor 75, the effective output capacitance of the FET 51, and a small shunt capacitance 76 resulting from the mechanical support of the inductor 74. The inductor 74, which also comprises a loosely coiled length of wire, serves to couple the potential (B+) lead to the drain 53 of the FET 51 through a feed-through capacitor 77 and also provides a variable inductance for tuning the third tunable circuit 71. Since the wire inductor 74 is loosely coiled, the third tunable resonant circuit 71 is tuned to the same resonant frequency as the first and second tunable resonant circuits 31, 32 by adjusting the spacing between the coils.

The loosely coiled wire inductor 74 of the present invention also represents a significant advance over prior CATV converters, which utilized a fixed choke to couple the potential (B+) lead to the drain of the FET. Not only is the wire inductor 74 far less expensive than a fixed choke, but it allows for a much more selective I.F. filter and amplifier unit 16. Since the impedance of the fixed choke is very high and the inductance is not variable, previous I.F. filter and amplifier units had no such third tunable circuit 71 comprising the output capacitance of the transistor and the fixed choke. They had only four tunable circuits analogous to the first, second, fourth, and fifth tunable circuits 31, 32, 72, 73 of the present invention. However, the variable inductance and low impedance of the wire inductor 74 of the present invention makes pssible another tunable circuit, i.e., the third tunable circuit 71, in addition to the four tunable circuits offered by previous I.F. filter and amplifier units. Thus, the I.F. filter and amplifier unit 16 of the present invention is much more selective, yet less expensive, than previous units.

The fourth and fifth tunable circuits 72, 73 are virtually identical to the first and second tunable circuits 31, 32 and represent a similar advance over the prior art. Each tunable circuit 72, 73 includes a fixed capacitor 80, 81 and a resonant element 82, 83 having an inductive wire 84, 85 disposed in proximity to a shield 86 which separates the two circuits 72, 73. One end of each resonant element 82, 83 is grounded directly while the other end is connected to ground through the fixed capacitor 80, 81. The fourth and fifth tunable circuits 72, 73 are each tuned to the same resonant frequency as the first, second, and third tunable circuits 31, 32, 71 and are tuned in the same manner as the first and second tunable circuits 31, 32, i.e., by adjusting the position of the wire 84a, 85a in relation to the shield 86.

The third and fourth tunable circuits 71, 72 are transmissively coupled to one another through the space between the lead 87 which connects the blocking capacitor 75 of the third tunable circuit 71 to ground and the inductive wire 84 of the fourth tunable circuit 72. The fourth and fifth tunable circuits 72, 73 are transmissively coupled to one another through a slit 88 in the shield 86. The amplified narrowband I.F. signal is supplied from the drain 53 of the FET to the third, fourth, and then fifth tunable circuits 71, 72, 73, where the out-of-band frequency components are repeatedly attenuated. The signal is then supplied from a certain point 89 (again determined according to standard impedance matching techniques) on the inductive wire 85 of the fifth tunable circuit 73 to the second mixer 17, where it is down-converted.

While a particular embodiment of the invention has been described above, the invention is not so limited. Alternative embodiments and modifications which would still be encompassed by the invention may be made by those skilled in the art, particularly in light of the foregoing teachings. Therefore, the following claims are intended to cover any alternative embodiments, modifications, or equivalents which may be included within the spirit and scope of the invention as claimed.

I claim as my invention:

1. A filter for use in a CATV converter which receives a wideband CATV signal comprising a plurality of channel bandwidths and converts said wideband CATV signal to a narrowband signal comprising a single channel bandwidth by applying said wideband signal to said filter to obtain said narrowband signal, said filter comprising a first tunable resonant circuit excited in response to said wideband signal, said first tunable circuit including a fixed capacitive element coupled to a variable inductance means for tuning said first tunable resonant circuit; a second tunable resonant circuit including a fixed capacitive element coupled to a variable inductance means for tuning said second tunable resonant circuit, said narrowband signal being received from said second tunable circuit; and a means for substantially shielding said first tunable resonant circuit from said second tunable resonant circuit, said first tunable resonant circuit being transmissively coupled to said second tunable resonant circuit through an aperture in said sheilding means, wherein at least one of said variable inductance means is provided by a wire disposed in proximity to and spaced from said shielding means, and wherein the inductance of said variable inductance means provided by said wire resonates with the respective fixed capacitive element to which it is coupled and said inductance is varied by adjusting the spacing of said wire from said shielding means in order to tune the tunable circuit including said wire.

2. The filter of claim 1 wherein said tunable resonant circuits do not include variable capacitance means for tuning said circuits.

3. A device for use in a CATV converter which receives a wideband CATV signal comprising a plurality of frequency components and converts said wideband CATV signal to an intermediate frequency signal comprising a plurality of higher frequency components, said device comprising means for receiving and amplifying said intermediate frequency signal, and a tunable resonant circuit for narrowing the bandwidth of said intermediate frequency signal, said means for receiving and amplifying having an output terminal, a certain amount of output capacitance being present on said output terminal, said tunable resonant circuit including a variable inductive element directly coupled to the output capacitance present on said output terminal and which resonates with said output capacitance, the inductance of said inductive element being varied to tune said tunable resonant circuit, wherein said variable inductance element comprises a wire including at least two turns of said wire, the spacing between which turns may be adjusted to vary the inductance of said wire.

4. A device for use in a CATV converter which receives a wideband CATV signal comprising a plurality of frequency components and converts said wideband CATV signal to an intermediate frequency signal comprising a plurality of higher frequency components, said intermediate frequency signal being applied to said device to obtain a narrowband intermediate frequency signal, said device comprising a first tunable resonant circuit receiving said intermediate frequency signal and including a first fixed capacitive element coupled to a first variable inductance means resonating with said first fixed capacitive element and providing means for tuning said first tunable resonant circuit; a second tunable resonant circuit including a second fixed capacitive element coupled to a second variable inductance means resonating with said second fixed capacitive element and providing means for tuning said second tunable resonant circuit; means for substantially shielding said first tunable resonant circuit from said second tunable resonant circuit, said first tunable resonant circuit being transmissively coupled to said second tunable resonant circuit through an aperture in said shielding means; a transistor having an input terminal coupled to said second tunable resonant circuit for amplifying said higher frequency components, said transistor also having an output terminal, a certain output capacitance being present on said output terminal; and a third tunable resonant circuit including a variable inductance means for tuning said third tunable resonant circuit directly connected to the output terminal of said transistor and which resonates with said output capacitance, said narrowband intermediate signal being obtained responsive to said third tunable resonant circuit.

5. The device of claim 4 wherein the variable inductance means of at least one of said first and second tunable resonant circuits includes a wire disposed in proximity to and spaced from said shielding means, and wherein the inductance of said variable inductance means is varied by adjusting the spacing of said wire from said shielding means.

6. The device of claim 4 wherein the variable inductance means of said third tunable circuit comprises a loosely coiled wire having at least two turns and wherein the inductance of said variable inductance means is varied by adjusting the spacing between said turns.

7. A CATV converter comprising means for receiving a wideband CATV signal having a plurality of frequency components; means for converting said wideband CATV signal to a wideband intermediate frequency signal having a plurality of higher frequency components; means for receiving said wideband intermediate frequency signal and passing and amplifying a signal comprising a narrow band of said higher frequency components and attenuating substantially all out-of-band frequency components, said passing and amplifying means including a first tunable resonant circuit receiving said wideband intermediate frequency signal and having a first fixed capacitive element coupled to a variable inductance means resonating with said first fixed capacitive element and providing means for tuning said first tunable resonant circuit, a second tunable resonant circuit having a second fixed capacitive element coupled to a variable inductance means resonating with said second fixed capacitive element and providing means for tuning said second tunable resonant circuit; means for substantially shielding said first tunable resonant circuit from said second tunable resonant circuit, said first tunable resonant circuit being transmissively coupled to said second tunable resonant circuit through an aperture in said shielding means, a transistor having an input terminal coupled to said second tunable resonant circuit for amplifying said frequency components, said transistor also having an output terminal, a certain output capacitance being present on said output terminal; and a third tunable resonant circuit including a variable inductance means for tuning said third tunable resonant circuit, said variable inductance means being directly coupled to said output capacitance; and means coupled to said third resonant circuit for converting said narrowband intermediate frequency signal to a narrowband signal comprising a plurality of lower frequency components, wherein said first and second variable inductance means each comprise a segment of wire disposed in proximity to and spaced from said means for shielding in the vicinity of said aperture, the resonant frequencies of said first and second tunable circuits being responsive to the respective spacings between said segments and said means for shielding.

* * * * *